(12) United States Patent
Schmidt et al.

(10) Patent No.: US 9,520,445 B2
(45) Date of Patent: Dec. 13, 2016

(54) INTEGRATED NON-VOLATILE MEMORY ELEMENTS, DESIGN AND USE

(75) Inventors: Heidemarie Schmidt, Dresden (DE); Yao Shuai, Dresden (DE); Shengqiang Zhou, Dresden (DE); Ilona Skorupa, Dresden (DE); Xin Ou, Grosserkmannsdorf (DE); Nan Du, Chemnitz (DE); Christian Mayr, Dresden (DE); Wenbo Luo, Dresden (DE)

(73) Assignee: HELMHOLTZ-ZENTRUM DRESDEN-ROSSENDORF E. V., Dresden (DE)

( * ) Notice: Subject to any disclaimer, the term of this patent is extended or adjusted under 35 U.S.C. 154(b) by 177 days.

(21) Appl. No.: 14/131,956

(22) PCT Filed: Jul. 12, 2012

(86) PCT No.: PCT/DE2012/200047
§ 371 (c)(1),
(2), (4) Date: Jul. 16, 2014

(87) PCT Pub. No.: WO2013/017131
PCT Pub. Date: Feb. 7, 2013

(65) Prior Publication Data
US 2014/0312400 A1     Oct. 23, 2014

(30) Foreign Application Priority Data

Jul. 12, 2011  (DE) .................. 10 2011 051 767
Mar. 20, 2012  (DE) .................. 10 2012 102 326
May 23, 2012  (DE) .................. 10 2012 104 425

(51) Int. Cl.
*H01L 27/22* (2006.01)
*H01L 45/00* (2006.01)
(Continued)

(52) U.S. Cl.
CPC .............. *H01L 27/228* (2013.01); *H01G 7/06* (2013.01); *H01L 27/2472* (2013.01);
(Continued)

(58) Field of Classification Search
CPC ..................................... H01L 29/872
See application file for complete search history.

(56) References Cited

U.S. PATENT DOCUMENTS 2,791,758 A * 5/1957 Looney ......................... 365/184
3,990,057 A   11/1976 Kumada
(Continued)

FOREIGN PATENT DOCUMENTS

DE           2502321 A1    8/1975
DE          10297767 T5    8/2005
(Continued)

OTHER PUBLICATIONS

International Search Report issued in the corresponding PCT/EP2012/200047 dated Mar. 6, 2013.
(Continued)

*Primary Examiner* — Eugene Lee
(74) *Attorney, Agent, or Firm* — Viering, Jentschura & Partner mbB (57) ABSTRACT

Various embodiments describe an integrated non-volatile component. The component may include a surface contact with associated mating contact wherein a ferroelectric layer is used as a conductive channel having variable conductivity and the surface contact and/or the associated mating contact are/is embodied as a rectifying contact and, as a result of an applied voltage between the surface contact and the associated mating contact, a non-volatile space charge zone forms in the surface contact terminal region and/or mating contact terminal region in the ferroelectric layer.

8 Claims, 7 Drawing Sheets

(51) Int. Cl.
H01L 31/0224 (2006.01)
H01L 31/032 (2006.01)
H01L 31/0368 (2006.01)
H01L 31/09 (2006.01)
H01G 7/06 (2006.01)
H01L 27/24 (2006.01)
H01L 29/43 (2006.01)
G06N 3/063 (2006.01)

(52) U.S. Cl.
CPC ...... *H01L 29/43* (2013.01); *H01L 31/022408* (2013.01); *H01L 31/032* (2013.01); *H01L 31/0368* (2013.01); *H01L 31/09* (2013.01); *H01L 45/065* (2013.01); *H01L 45/1206* (2013.01); *H01L 45/1226* (2013.01); *H01L 45/1233* (2013.01); *H01L 45/147* (2013.01); *G06N 3/0635* (2013.01); *Y02E 10/50* (2013.01)

(56) References Cited

U.S. PATENT DOCUMENTS

| | | | | |
|---|---|---|---|---|
| 4,243,895 | A * | 1/1981 | Nazarian et al. | 326/100 |
| 4,638,342 | A * | 1/1987 | Freeouf et al. | 257/264 |
| 5,099,305 | A * | 3/1992 | Takenaka | 257/295 |
| 5,229,309 | A * | 7/1993 | Kato | 257/295 |
| 5,262,983 | A * | 11/1993 | Brennan | G11C 11/22 365/145 |
| 5,372,859 | A * | 12/1994 | Thakoor | H01L 28/60 257/E21.009 |
| 5,578,846 | A * | 11/1996 | Evans et al. | 257/295 |
| 5,623,439 | A * | 4/1997 | Gotoh et al. | 365/145 |
| 6,013,950 | A * | 1/2000 | Nasby | 257/734 |
| 6,049,110 | A * | 4/2000 | Koh | 257/347 |
| 6,414,300 | B1 | 7/2002 | Mazure-Espejo et al. | |
| 6,624,462 | B1 * | 9/2003 | Kohara | C23C 14/0036 257/295 |
| 6,937,500 | B2 | 8/2005 | Gudesen et al. | |
| 9,336,870 | B1 * | 5/2016 | Mickel | G11C 13/0011 |
| 2002/0025637 | A1 | 2/2002 | Maeda | |
| 2005/0111252 | A1 | 5/2005 | Bednorz et al. | |
| 2006/0239060 | A1 | 10/2006 | Shimada | |
| 2007/0029592 | A1 | 2/2007 | Ramesh | |
| 2007/0045595 | A1 * | 3/2007 | Kondo | H01L 27/11502 252/500 |
| 2007/0164336 | A1 | 7/2007 | Saito et al. | |
| 2007/0228432 | A1 * | 10/2007 | Ishihara | G11C 11/22 257/295 |
| 2008/0246366 | A1 * | 10/2008 | Burgener | H02N 11/002 310/300 |
| 2009/0050949 | A1 * | 2/2009 | Maruyama | G11C 11/22 257/295 |
| 2009/0108706 | A1 | 4/2009 | Okuno et al. | |
| 2009/0302886 | A1 | 12/2009 | Karg et al. | |
| 2010/0195369 | A1 * | 8/2010 | Zhao | G11C 11/22 365/145 |
| 2010/0215836 | A1 | 8/2010 | Park | |
| 2010/0243980 | A1 | 9/2010 | Fukumizu | |
| 2010/0301436 | A1 * | 12/2010 | Sashida | H01L 21/28556 257/421 |
| 2011/0101432 | A1 * | 5/2011 | Wang | H01L 27/11507 257/295 |
| 2011/0292134 | A1 * | 12/2011 | Sasaki | B41J 2/14233 347/68 |
| 2012/0020140 | A1 | 1/2012 | Chen | |
| 2012/0187325 | A1 | 7/2012 | Hoffmann et al. | |
| 2012/0292677 | A1 * | 11/2012 | Dubourdieu et al. | 257/295 |
| 2013/0037092 | A1 * | 2/2013 | Cheong | H01L 27/2472 136/254 |

FOREIGN PATENT DOCUMENTS

| | | |
|---|---|---|
| DE | 60314531 T2 | 2/2008 |
| DE | 102009035425 A1 | 2/2011 |
| EP | 1078371 B1 | 11/2001 |
| EP | 1628352 A1 | 2/2006 |
| JP | 10056088 A | 2/1998 |
| WO | 2004017328 A1 | 2/2004 |
| WO | 2010014974 A2 | 2/2010 |
| WO | 2010151844 A2 | 12/2010 |
| WO | 2011100551 A1 | 8/2011 |

OTHER PUBLICATIONS

Wang et al., "Switchable diode effect and ferroelectric resistive switching in expitaxial BiFeO3 thin films", Applied Physics Letters 98, pp. 192901-01-192901-3, May 10, 2011.
Shuai et al., "Nonvolatile bipolar resistive switching in Au/BiFeO3/Pt", Journal of Applied Physics, pp. 124117-124-117, Jun. 29, 2011.
Choi et al., "Switchable Ferroelectric Diode and Photovoltaic Effect in BiFeO3", Science, vol. 324, pp. 63-66, Apr. 3, 2009.
Ueno et al., "Field-effect transistor on SrTiO3 with sputtered Al2O3 gate insulator", Applied Physics Letters, pp. 1755-1757, Sep. 1, 2003.
Lee et al., "Phase Change Technology and the future of main memory", IEEE MICRO, pp. 131-141, 2010.
Park et al., "Electric field dependence of ferroelectric phase transition in epitaxial SrTiO3 films on SrRuO3 and La0.5Sr0.5CoO3", Applied Physics Letters, vol. 77, No. 3, pp. 435-437, 2000.
Chen et al., "Nonlinearity in the high-electric-field piezoelectricity of epitaxial BiFeO3 on SrTiO3", Applied Physics Letters 100, pp. 062906-1-062906-4, Feb. 10, 2012.
Teng et al., "Pressure induced ferroelectric phase transition in potassium nitrate", Solid State Communications, vol. 9, pp. 465-469, 1971.
Yang et al., "Above-bandgap voltages from ferroelectric photovoltaic devices", Nature Nanotechnology, pp. 143-147, Jan. 10, 2010.
Alexe et al., "Tip-enhanced photovoltaic effects in bismuth ferrite", Nature Communications, pp. 1-5, Mar. 29, 2011.
Kundys et al., "Light-indued size changes in BiFeO3 crystals", Nature Materials, pp. 803-805, 2010.
Moll et al., "Two terminal devices and integrated circuits", IEEE Transaction on Electron Devices, pp. 338-339, Sep. 1963.
Wu, "A New Ferroelectric Memory Device, Metal-Ferroelectric-Semiconductor Transistor"; Electronic Device ED-21; IEEE, vol. ED-21, No. 8, pp. 449-503, Aug. 1974.
Ma et al., "Why is nonvolatile ferroelectric memory field-effect transistor still elusive?"; IEEE Electron Device Letters; vol. 23, No. 7, Jul. 2002, pp. 386-388.
Office Action issued for the priority application DE 102012102326.3 on Jan. 8, 2013.
Office Action issued for the priority application DE 102011051767.7 on Feb. 1, 2012.
Office Action issued for the priority application DE 102012104425.2 on Mar. 6, 2013.
Takeshi Tomio et al., Control of electrical conductivity in laser deposited SrTiO3 thin films with Nb doping, AIP Journal of Applied Physics, Nov. 15, 1994, pp. 5886 to 5890.
F. M. Pontes et al., High dielectric constant of SrTiO3 thin films prepared by chemical process, Journal of Materials Science 35, 2000, pp. 4783 to 4787.

* cited by examiner

INTEGRATED NON-VOLATILE MEMORY ELEMENTS, DESIGN AND USE

RELATED APPLICATIONS

The present application is a national stage entry according to 35 U.S.C. §371 of PCT application No. PCT/DE2012/200047 filed on Jul. 12, 2012, which claims priority from German application Nos. 10 2011 051 767.7 filed on Jul. 12, 2011, 10 2012 102 326.3 filed on Mar. 20, 2012, and 10 2012 104 425.2 filed on May 23, 2012, and is incorporated herein by reference in its entirety.

TECHNICAL FIELD

Various embodiments relate to an integrated electronic component which can be used as a non-volatile memory component or an analog memory or as an integrable electrode with statically positively and/or statically negatively charged boundary layers that can be positioned in a non-volatile manner.

BACKGROUND

A transistor is an electronic semiconductor component which is used for switching and amplifying electric currents. The designation is a contraction of the designation transient resistor, which was intended to describe the transistor as a resistor controllable by current.

The field effect transistor (FET—field effective transistor) is an active nonlinear semiconductor component. In an FET the current flow (source-drain current) between source and drain is controlled by a voltage at the control electrode (gate). In individual transistors, a fourth terminal bulk (substrate) is generally connected to the source and not routed out separately. The control electrode can be a MOS structure (MOSFET—metal oxide semiconductor field effect transistor) a p-n junction (JFET—junction field effect transistor) or a Schottky contact (MESFET—metal semiconductor field effect transistor). The FET is a unipolar transistor whose current consists only of majority charge carriers. Therefore, it is unimportant to the FET whether the current flows from source to drain, or vice versa. It can therefore switch alternating currents, in contrast to bipolar transistors. The use of the various designs of field effect transistors depends primarily on the demands in respect of stability and noise behavior. In principle, there are field effect transistors for all areas of use, but MOSFETs are more likely to be used in digital technology, and JFETs and MOSFETs are more likely to be used in radio-frequency technology. FETs both on the basis of silicon and on the basis of III/V semiconductors, in particular gallium arsenide GaAs, are used for applications in radio-frequency technology. MOSFETs are used for FETs on the basis of the III/V semiconductor GaAs. Drain and source terminals are ohmic contacts, while the gate terminal is a Schottky contact. A differentiation of FETs depends on the channel type used: in the enhancement-mode FET, the conduction channel is interrupted as long as a sufficient gate voltage is not present. In the depletion-mode FET, the channel is conducting as long as it is not pinched off by a sufficiently high gate voltage. FETs are distinguished by usually lower losses than bipolar transistors. They enable very fast switching and are thus suitable for very high frequencies. FETs are distinguished by the fact that they do not have a storage type as in bipolar transistors (BJT—bipolar junction transistor). FETs can easily be connected in parallel.

FETs are generally less expensive than comparable bipolar transistors. They can be driven without power in the static case, but this leads to high charge-reversible losses at the gate.

A major advantage of FETs is the relative insensitivity to overvoltage between drain and source. When the maximum voltage is exceeded between drain and source, a so-called "breakdown" takes place. This is comparable to the Zener effect. If the quantity of energy is limited, this breakdown is reversible and the FET registered here is not destroyed.

FETs also have disadvantages. They are suitable for high voltages only to a limited extent, since losses starting from approximately 250 V are higher than in the case of an insulated gate bipolar transistor (IGBT). The parasitic diode in parallel with the drain-source path is always contained. The off switching behavior of these diodes is usually poorer than in the case of separate diodes, which often leads to undesirable oscillations. FETs are more sensitive to electrostatic discharge (ESD) at the gate than a BJT. FETs have a positive temperature coefficient (TC); the on resistance (RDS-on) is greatly temperature-dependent and rises approximately by a factor of 2 in the temperature range from 25° C. (data sheet indication) to ~150° C. As a result, the losses and thus the heating of the component also increase.

The basic functioning of the ferroelectric field effect transistor FeFET was predicted in 1963 by Moll and Tarui [Moll, J. L.: IEEE Electronic Devices ED-10 (1963) 338]. An FeFET is a MOSFET including a ferroelectric oxide layer. The first Si-based FeFET including the ferroelectric layer $Bi_4Ti_3O_{12}$ was realized in 1974 [Wu, S. Y.: IEEE Electronic Devices ED-21 (1974) 499].

In the case of an FeFET, the gate insulation is replaced by a ferroelectric dielectric (analogously to the floating gate in flash memories). As a result of the electrical polarization of said dielectric, the current-voltage characteristic of the source-drain junction is influenced: depending on the direction of polarization, the transistor turns off or turns on. The FeFET is written to by the application of a corresponding voltage between gate and source. The FeFET is read by the measurement of the current upon application of a voltage between source and drain. The read-out process is non-destructive.

In comparison with standard flash memories FeFETs have ferroelectric, non-volatile memories. FeFETs are distinguished by high long-term storage of what is written, and they manage with low write voltages, have a low current consumption and a high radiation hardness.

FeFETs are disadvantageous because the interface between semiconductor and ferroelectric layer has to be formed very precisely. Unfortunately, they can only have a small lattice mismatch, since otherwise uncontrolled interfacial states or traps occur. In order to avoid the interfacial states, thin slightly crystalline intermediate layers are inserted between substrate and ferroelectric layer. The ferroelectric layer must be pinhole-free.

The most common circuit variant for ferroelectric random access memories (FRAMs) is the so-called 1T1C and 2T2C cells having respectively one and two transistors and capacitors including ferroelectric dielectric. The transistor is required in any case for selecting the memory cell to be written to, since ferroelectrics do not have a sharp changeover voltage, rather the changeover probability increases with the strength of the voltage and the duration of the voltage pulse. The cells are written to by the polarization of the ferroelectric being set by a voltage pulse after the selection of the desired memory cell via the word and bit lines. The changeover between storage and erasure processes is realized in each case by a change of polarization in a ferroelectric layer.

It is advantageous that FRAMs, compared with conventional read-only memories, require no power supply for data retention. Even after the electric field has been switched off, the set state of the cell is maintained. FRAMs are furthermore compatible with conventional EEPROMs and have a practically unlimited lifetime, on account of theoretically 10 quadrillion read/write cycles, $10^{10}$ read/write cycles being guaranteed. The write time with a value of approximately 100 ns is approximately comparable to a standard SRAM.

The cell state is read out by the application of an electric field. If a change of polarization was brought about, the intensity of the current flowing through the cell changes. Since the reading method, as in the case of DRAM, has a destructive effect, that is to say that the cell content is erased, each read process is followed by a write process.

A further development of FRAMs is resistive random access memories (ReRAMs), in which it is possible to save the data situated in the RAM in the switched-off state. They are distinguished by the fact that they are non-volatile, the states are not destroyed during reading, and consume low power. ReRAMS enable a compact cell design, which in turn leads to high integration densities.

A further development of FeFETs is ferroelectric memory field effect transistors (FEMFETs), in which the gate electrode is a multilayer system consisting of an insulator, a ferroelectric and a metal. FEMFETs combine all the advantages of FeFETs. In the case of the FEMFET and also in the case of the FeFET, in comparison with the FET, just the gate electrode is replaced by a multilayer system including a ferroelectric layer. What is disadvantageous is that FEMFETs can only be processed at high temperatures. The buffer layer is very thick, since the ratio of the thickness of the ferroelectric layer to the thickness of the buffer layer is approximately 3 to 5. What is likewise disadvantageous is that generally raw earth manganites such as $CeMnO_3$, $YMnO_3$ or lead zirconium titanate (PZT) or barium titanate ($BaTiO_3$), are given consideration as ferroelectric material. Strontium bismuth tantalate (SBT) can likewise be used as a ferroelectric layer. The dielectric constant $\in_r$ of the buffer layer is $\in_r \sim 20$ to 50.

US 2005/0111252 A1 describes a field effect transistor including a source electrode, a drain electrode, a channel between the source and drain electrodes, and a gate electrode, which is separated from the channel by a continuous insulating layer or by a Schottky barrier. The channel in US 2005/0111252 A1 includes a switchable material, the conductivity of which is reversibly switchable between a state of low conductivity and a state of high conductivity. Each state of the conductive channel is persistently switchable. The field effect transistor described in US 2005/0111252 A1 has the disadvantage that the channel cannot be switched into the low conductivity state. Only the switching of the channel into the more highly conducting state by the application of an electrical voltage, injection of charge carriers, thermal and/or laser radiation is described. The switchable materials ($SrZrO_3$, $BaSrTiO_3$, $Ta_2O_5$, $Ca_2Nb_2O_7$) are piezoelectric and not persistently switchable. The polarization state in these materials changes with the aid of electric fields, injection of charge carriers and heating. The material ($SrTiO_3$) specified in US 2005/0111252 A1 exhibits filament formation as the switching mechanism. Filament formation is disadvantageous since it cannot be set controllably.

[Ueno, K. [et al.]: Field-effect transistor on SrTiO3 with sputtered Al2O3 gate insulator. In: Appl. Phys. Lett. Vol. 83, No. 9, Sep. 1, 2003, pages 1755-1757, S.35] uses a MISFET including an insulator (amorphous $Al_2O_3$) on a semiconducting layer ($SrTiO_3$). The control gate consists of the insulator and a metal contact, and the voltage applied to the control gate, e.g. the gate-source voltage, controls the extent of the conducting channel in the semiconducting layer. On account of the low breakdown field strength of the amorphous $Al_2O_3$ (4 $MVcm^{-1}$), the negative voltage (20 V) that can maximally be applied to the MISFET cannot be chosen to be high enough that the channel is completely pinched off by the application of a negative voltage. The conductivity of the channel is controllable only in a volatile fashion by means of the gate voltage. When no gate voltage is applied, the channel always has the conductivity value which corresponds to a gate voltage of zero volts, independently of what gate voltage was applied previously.

A very major problem is a retention time of only a few days, instead of the usual 10 years, and the occurrence of leakage currents at the control electrode or depolarization fields which reduce the polarization charge of the ferroelectric material and thus the retention time [Ma, T. P. et al.: Why is nonvolatile Ferroelectric Memory Field Effect Transistor Still Elusive. IEEE ELECTRON DEVICE LETTERS, VOL. 23, No. 7, July 2002, pages 386-389].

If analog signals are intended to be stored for a relatively long period of time and/or noise-independently (e.g. as reference or calibration signals), they are generally converted into digital signals, which have to be converted into analog values again for use in an analog circuit. The use of volatile resistive memory components which replace the conversion steps mentioned already reduces the application outlay and makes the circuit more robust.

The microphysical cause of the resistive switching processes is different for resistive memory components including different materials.

Resistive switching in resistive memory components composed of Cu-doped $Ge_{0.3}Se_{0.7}$ solid electrolytes is probably based on the electrochemical growth and on the electrochemical decomposition of metallic, filamentary paths (filament formation), which form in the solid electrolyte between an oxidizable electrode (Cu) and an inert electrode (Pt) when a voltage is applied.

Resistive memory components with filament formation can switch between two resistance states.

The performance features of resistive memory components are non-volatility, operation at low voltages and currents, a large $R_{off}/R_{on}$ ratio between the resistances in the "switched-off" ($R_{off}$) state and in the "switched-on" ($R_{on}$) state, fast switching times and long service lives.

Resistive switching in resistive memory components including piezo- or ferroelectric solids with metal contacts is based on the redistribution of free charge carriers at the interface between the metal contacts and the piezo- and ferroelectric solids and the shift in the position of the polarization charge when a voltage is applied.

Non-volatile resistive multilevel switching will not be possible in resistive memory components with filament formation on account of the stochastic nature of filament formation.

A neural network is constructed in a matrix-type fashion and has neurons at ends of columns and/or rows, said neurons all being connected to one another, according to the matrix, via the crossover locations, the so-called synapses.

Non-volatile analog memory elements are required for an optimum hardware realization of neural networks.

Phase change materials change their phase from crystalline to amorphous above the phase transformation temperature and are currently used primarily for latent heat storage and for data storage. The very high current densities to be used are problematic; said current densities can lead to electromigration in the metal tracks. Moreover, said phase change materials have to be thermally insulated. By way of example, the current densities for attaining the phase transformation temperature of 600° C. in GeSbTe are more than $10^7$ A/cm$^2$ [Lee, Benjamin C. et al.: *Phase Change-Technology and the Future of Main Memory*. 36$^{th}$ Annual International Symposium on Computer Architecture Location: Austin, Tex. 2009, IEEE MICRO 30 (2010), pages: 131-141].

An electric field forms between a statically charged boundary layer and an electrically conducting counterelectrode.

If the region between two electrically conducting electrodes is filled with a solid, liquid or gaseous material, then upon the application of an external electrical voltage the distribution of the electric field lines between the electrically conducting electrodes is determined by the dielectric properties of the solid, liquid or gaseous material.

The electric field lines begin at the positively charged electrode and end at the negatively charged electrode and illustrate the Coulomb force on electrical charges (electrons, holes, ions, charged particles) in the region between the positively and negatively charged electrodes.

If the Coulomb force is high enough, electrical charges can drift in the electric field between the electrodes as far as the oppositely charged electrode (electrons to a positively charged electrode) and on the way they can interact with other particles, ionize them or recombine with other particles.

If the distance between the electrode is too large and/or if the externally applied electrical voltage is too small, then not all the electrical charges drift in the electric field as far as the oppositely charged electrode, but rather recombine with other charged and uncharged particles.

Given different distributions of electrically active impurity atoms (donors and acceptors), semiconductor materials have intrinsic electric fields, without an electrical voltage having to be externally applied to the doped semiconductor material. Electrical charges move directionally (drift) in intrinsic electric fields.

Photocomponents, e.g. solar cells, photoelements and photodiodes, are constructed like semiconductor diodes, in principle, and do not differ fundamentally in the physical principle of action. On account of the photovoltaic effect, photogenerated charge carriers are separated in the electric field of the space charge zone of the semiconductor diode. Photodiodes and photoelements generally serve for measuring radiation, whereas solar cells generally serve for converting solar energy into electrical energy.

In order that the charge carriers that are photogenerated in the absorbent region of photocomponents contribute to the photocurrent in the semiconductor photocomponent, the photogenerated charge carriers have to reach the contact electrodes, without recombining on the way there.

If the contact electrodes are not connected, then an open-circuit voltage in the forward direction is present at the semiconductor photocomponent. With the use of only one absorber material, the open-circuit voltage cannot be greater than the bandgap of the absorber material. If the contacts are connected, then a photocurrent flows as a short-circuit current through the photocomponent.

Since the contact electrodes have to lie in direct proximity to the absorbent region of the photocomponent and since the physical principle of action of the photocomponents is based on the generation of photogenerated charge carriers, the separation thereof and transport to the contact electrodes, photocomponents having absorbent regions in which space charge zones can form on account of doping have preferably been used heretofore.

Through the use of transparent conducting contact electrodes and transparent substrate material, the shading of the absorbent region of the photocomponent by contact electrodes and substrate material can be significantly reduced.

A solar cell including only one type of absorber material can only convert the solar energy with low efficiency. Optimum conversion is effected only for the solar radiation whose energy corresponds to that of the electronic bandgap of the absorber material. A tandem solar cell combines solar cells including a plurality of absorber materials connected via tunnel barriers in a two-terminal fashion or absorber materials linked via transparent contact electrodes in a multi-terminal fashion. The photocurrent is comparable in both types of tandem solar cells and is significantly increased compared with the photocurrent of a single solar cell. The open-circuit voltage of a tandem solar cell with tunnel barriers cannot be greater than the sum of the bandgaps of all of the absorber materials used.

Ferroelectric materials, for example $BiFeO_3$, without an external electrical voltage being applied, have ferroelectric domains with identical orientation and identical absolute value of the spontaneous polarization. Piezoelectric materials, for example $BaTiO_3$, when an external electrical voltage is applied, have piezoelectric domains with identical orientation and identical absolute value of the spontaneous polarization. Between the domain boundaries, intrinsic electric fields form in the domains of piezo- and ferroelectric materials. The lateral extent of the domains ranges from a few nanometers up to a few micrometers to millimeters. The extent of the domain boundaries is a few nanometers.

On account of complicated domain forms, the relationship between the transport of electrical charges and the intrinsic fields in piezo- or ferroelectric domains has not been investigated very much heretofore.

Moreover, leakage currents at crystallographic defects or at domain boundaries in piezo- or ferroelectric materials are superposed on the drift current in the intrinsic fields in piezo- or ferroelectric domains.

Directional photocurrents have been observed in ferroelectric materials without an externally applied electrical voltage along the direction of intrinsic electric fields in ferroelectric domains. The open-circuit voltage depends on the lateral extent of the ferroelectric domains. The short-circuit current flows in the direction of the ferroelectric polarization.

The photovoltaic effect is fundamentally different in doped semiconductors and in ferroelectrics. The photocurrent in ferroelectrics is a few nA/cm$^2$ in comparison with a few µA/cm$^2$ in doped semiconductors.

The utilization of the photovoltaic effect in ferroelectrics presupposes the development of ferroelectrics having small electronic bandgaps and good volume conductivity properties.

In this regard, the photovoltaic effect in $BiFeO_3$ with semitransparent gold electrodes upon absorption of electromagnetic waves having a wavelength of 630 nm and an irradiance of 20 mW/cm$^2$ is 7.35 µA/cm$^2$ [T. Choi et al.: *Switchable ferroelectric diode and photovoltaic effect in BiFeO₃*. Science 324, 63 (2009)].

On account of the separation of photogenerated charge carriers at the domain walls having an extent of a few nanometers in $BiFeO_3$, open-circuit voltages of 16 V and short-circuit currents of 120 µA/cm² have been observed [S. Y. Yang et al.: *Above-bandgap voltages from ferroelectric photovoltaic devices*. Nature Nanotechnology 5, 143 (2010)].

The potential drop at the domain walls in $BiFeO_3$ was determined as 10 mV and the open-circuit voltage between two contacts at the surface of $BiFeO_3$ is determined by the intrinsic electric field in which photogenerated charge carriers can drift, without recombining. Said intrinsic electric field is approximately 7 $kVcm^{-1}$ in doped semiconductors and 50 $kVcm^{-1}$ in each domain wall of the ferroelectric material [S. Y. Yang et al.: *Above-bandgap voltages from ferroelectric photovoltaic devices*. Nature Nanotechnology 5, 143 (2010)].

It has been observed that an electrode having a contact area of a few nanometers can effectively collect photogenerated charge carriers in $BiFeO_3$ [M. Alexe et al.: *Tip-enhanced photovoltaic effects in bismuth ferrite*. Nature Communications 2:256, 1-4 (2011)].

By means of a superposition of photovoltaic and piezoelectric effects, it is possible to change the volume of ferroelectric materials upon irradiation with electromagnetic waves [B. Kundys et al.: "*Light-induced size changes in $BiFeO_3$ crystals*. Nature Materials 9, 803 (2010)].

SUMMARY

The problem addressed by the disclosure is that of describing an arrangement of piezo- and/or ferroelectric layers with at least two metallically conducting contacts in electrical components which can be utilized as conductive channels in non-volatile memory components.

In this context, in the case of use in a FET, the intention is to prevent the occurrence of leakage currents at the control electrode and depolarization fields on account of the configuration of the FET with a ferroelectric channel.

Furthermore, the problem addressed by the invention is that of integrating the arrangement of a non-volatile ferroelectric memory into a FET with a ferroelectric channel.

A further problem addressed is that of describing an arrangement having at least one voltage-switched, non-volatile resistance value, and specifying a design of an electrode integrable on different length scales with static charge for forming electric fields between the integrable electrode and an electrically conducting counterelectrode.

For all arrangements the design and the possibilities for use thereof are specified.

The problem concerning the design of a FET 1B is solved by the use of a ferroelectric layer 11 as conductive channel in an integrated non-volatile memory component between surface contact S and associated mating contact O, wherein at least one of the two contacts is embodied as a rectifying contact. In that case, one or two non-volatile space charge zones 15 form(s) in the top and/or bottom terminal region in the ferroelectric layer 11.

For producing an integrated non-volatile memory element 1A according to the invention, a ferroelectric layer 11 is applied on a rectifying or non-rectifying bottom contact O. The conductivity of the ferroelectric layer is locally modified within individual regions. The regions can be modified by means of ion implantation, e.g. oxygen, helium, or Ar, and subsequent thermal treatment in the range of the growth temperature of the ferroelectric layer, e.g. at 550° C. in the case of $BiFeO_3$. A rectifying or non-rectifying top contact is then applied. What is important here is that at least one of the two contacts is embodied as a rectifying contact.

Optionally, an insulating layer 16I having a high crystallization temperature can be applied before the ferroelectric layer 11 is applied to the bottom contact O.

The extension of the integrated non-volatile memory element 1A to integrated field effect transistors 1B is possible as a result of a local modification of the design of the FeFET.

The extension of the design of the integrated non-volatile memory component 1A to analog memories 1C is solved by the use of a passive capacitor structure including a piezo- or ferroelectric material 11 having locally different conductivities having a phase dependent on the electric field, having metallically conducting surface and associated rear-side contacts, and the setting of a locally different voltage drop in the piezo- or ferroelectric material.

The extension of the principle of the memory component to the design of an integrable electrode C is solved by the use of an active capacitor structure composed of at least two regions including piezo- or ferroelectric material with metallically conducting contacts S and O, wherein the structural, electronic and/or polarization properties of adjoining piezo- or ferroelectric materials differ, and wherein at the interfaces between the piezo- or ferroelectric materials a statically charged boundary layer in each case forms and the distance of the statically charged boundary layer can be set or shifted in a non-volatile manner by the application of a voltage.

BRIEF DESCRIPTION OF THE FIGURES

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

The problem is solved by the use of a ferroelectric layer 11 as a conductive channel in an integrated non-volatile memory component 1A, between bottom contact O and top contact S, wherein at least one of the two contacts is embodied as a rectifying contact. In that case, one or two non-volatile space charge zones 15 form(s) in the top and/or bottom terminal region in the ferroelectric layer 11.

For producing an integrated non-volatile memory element according to the invention, a ferroelectric layer is applied on a rectifying or non-rectifying bottom contact. The conductivity of the ferroelectric layer is locally modified within individual regions. The regions can be modified by means of ion implantation, e.g. oxygen, helium, or Ar, and subsequent thermal treatment in the range of the growth temperature of the ferroelectric layer, e.g. at 550° C. in the case of $BiFeO_3$. A rectifying or non-rectifying top contact is then applied. What is important here is that at least one of the two contacts is embodied as a rectifying contact.

Optionally, an insulating layer 16I having a high crystallization temperature can be applied before the ferroelectric layer 11 is applied to the bottom contact.

The extension of the integrated non-volatile memory element 1A to integrated field effect transistors 1B is possible as a result of a local modification of the design of the FET.

The problem is solved by the use of a passive capacitor structure including a piezo- or ferroelectric material having locally different conductivities having a phase dependent on the electric field, having metallically conducting surface and associated rear-side contacts, and the setting of a locally different voltage drop in the piezo- or ferroelectric material.

Piezo- or ferroelectric materials (PF material) can have different phases. Different phases differ with regard to their crystal structure, their electronic band structure and their bandgap and also with regard to their piezo- or ferroelectric properties and their spontaneous polarization charges.

For each strain state of the piezo- or ferroelectric material there is a phase of minimum energy. On account of the piezoelectric effect, i.e. the change of volume in an electric field, the strain state in piezo- or ferroelectric materials is controlled by means of an electric field by the application of an electrical voltage.

When a voltage is applied between opposite contacts, the majority of the voltage is dropped in the regions of lowest conductivity, on account of the differing local conductivity in the PF material, with the result that a very high electric field can form in the regions of low conductivity.

The piezo- or ferroelectric material changes its phase in the event of a critical field strength being exceeded. By way of example, the critical electric field strength in $BiFeO_3$ is 176 MV/m [Pice Chen et al.: *Nonlinearity in the high-electrics-field piezoelectricity of epitaxial $BiFeO_3$ on $SrTiO_3$*. Appl. Phys. Lett. 100, 062906 (2012)]. In the event of this field strength being exceeded, $BiFeO_3$ changes its structure from rhombohedral to tetragonal, its bandgap from 2.1 eV to 2.7 eV and its spontaneous polarization change from 100 $\mu C/cm^2$ to 150 $\mu C/cm^2$. Strains brought about by high electric fields lead to a structural change in other piezo- and ferroelectric materials as well. That has also been observed in other thin films and nanostructures, e.g. in $SrTiO_3$ thin films [K. C. Park et al.: *Electric field dependence of ferroelectric phase transition in epitaxial $SrTiO_3$ films on $SrRuO_3$ and $La_{0.5}Sr_{0.5}CoO_3$*. Appl. Phys. Lett. 77, 435 (2000)] and in $KNO_3$ [M. K. Teng et al.: *Pressure induced ferroelectric phase transition in potassium nitrate*. Solid State Communication 9 (1971) 465].

Spontaneous polarization charges are localized at the structure interfaces between the piezo- or ferroelectric material of different phases. The non-volatility of this localization is dependent on the band alignment, that is to say on the stepped change in the electronic band structure at the structure interface. The surface density of the spontaneous polarization charge localized at the structure interface is dependent on the difference in the spontaneous polarization charge in the different phases.

For the non-volatile localization of the spontaneous polarization charge at the structure interface it is expedient that the spontaneous polarization charges can be kept laterally in the region between the contacts and cannot drift into other regions. It is expedient to use a polycrystalline piezo- or ferroelectric material, wherein the crystallites are smaller than the lateral extent of the surface contacts or mating contacts. Another possibility is to use a structured, epitaxial piezo- or ferroelectric material having structure sizes smaller than the lateral extent of the surface contacts or mating contacts.

The position of the interface and the difference in the spontaneous polarization charges between different phases of the piezo- or ferroelectric material determine the value of the resistance of the piezo- or ferroelectric material between opposite contacts and thus the non-volatile state of the resistive memory component, which are altered in a controlled manner by an externally applied voltage.

In comparison with phase change materials which require very high current densities for changing their phase from crystalline to amorphous above a phase transformation temperature, the current flow in the case of phase change materials which change their phase above a critical electric field strength (PF materials) is low and depends only on where the structure boundary between the different piezo- or ferroelectric phases between two opposite contacts is shifted to, and on the magnitude of the difference in the spontaneous polarization charge of the two different piezo- or ferroelectric phases. The current flow is additionally determined by the time required to change the localization location of the spontaneous polarization charge by applying an external voltage.

As a result of the low current flow (displacement current for changing the position of the spontaneous polarization charge), it is simultaneously possible to avoid electromigration in the metal tracks of the contacts used. Moreover, there is no need for simultaneous thermal insulation of the phase change materials which change their phase above a critical electric field strength.

Figure 5:
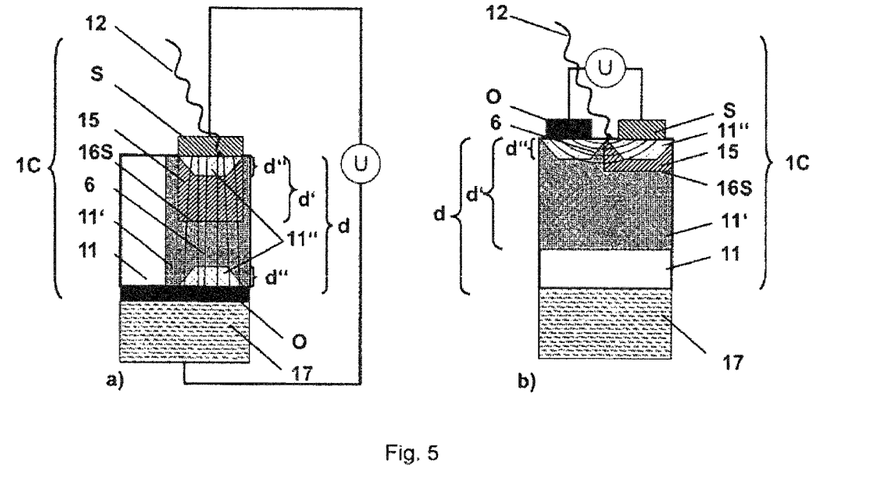
FIG. 5 shows an integrated analog memory 1C with piezo- or ferroelectric layer in the strain-free phase 11 and with modified, ferroelectric regions 11' and 11", wherein the surface contact S and the mating contact O are fitted (a) to different sides and (b) to identical sides of the analog memory 1C.

FIG. 5 shows the use of the integrated non-volatile analog memory according to the invention in a piezo- or ferroelectric thin film on a carrier material 17 with a rear-side contact O and an opposite front-side contact S (FIG. 5 a)) or with a rear-side contact O and a front-side contact S fitted on the same side of the piezo- or ferroelectric material (FIG. 5b)). On account of the modification during the layer growth or as a result of modification by means of ion beams, laser beams, thermal beams and/or electron beams 2, the regions 11, 11' and 11" in the piezo- or ferroelectric material have a different extent d, d' and d" and different electrical conductivities. It is recommendable to modify the piezo- or ferroelectric layer 11 preferably over a large area by means of laser and/or ion beams and to modify the regions 11' preferably locally by means of ion and/or electron beams.

Preferably, the electrical conductivity is lowest in the regions 11" and 11' near the front-side contact S and/or near the rear-side contact O, with the result that an externally applied voltage U is dropped primarily in the regions 11" and 11' and causes a structural phase transition when a critical electric field strength or the threshold voltage $U_{crit}$ is exceeded. The structure boundary 16S separates the regions of high conductivity in a piezo- or ferroelectric phase that is stable without strain from the regions of low conductivity in a piezo- or ferroelectric phase that is stable under strain. The differences in the electronic band structure and in the spontaneous polarization charge of both phases at the structure boundary 16S cause a stepped change in the conduction band and the valence band by means of the piezo- or ferroelectric material. The stepped change in the conduction band and in the valence band causes the localization of spontaneous polarization charge at the structure boundary 16S. When the voltage U is switched off, the localized polarization charge cannot drift away or diffuse away from the structure boundary 16 on account of the stepped change in the conduction band and in the valence band. An externally applied voltage U shifts the polarization charge localized at the structure boundary 16S, and thus the structure boundary itself. The resistance of the integrated non-volatile resistive memory depends on the position of the structure boundary 16S and is high if the structure boundary is shifted far into the piezo- or ferroelectric material. If the structure boundary lies near one of the two opposite contacts (FIG. 5a)) or the contacts arranged on the same side (FIG. 5b)), the resistance of the resistive memory is low.

Figure 6:
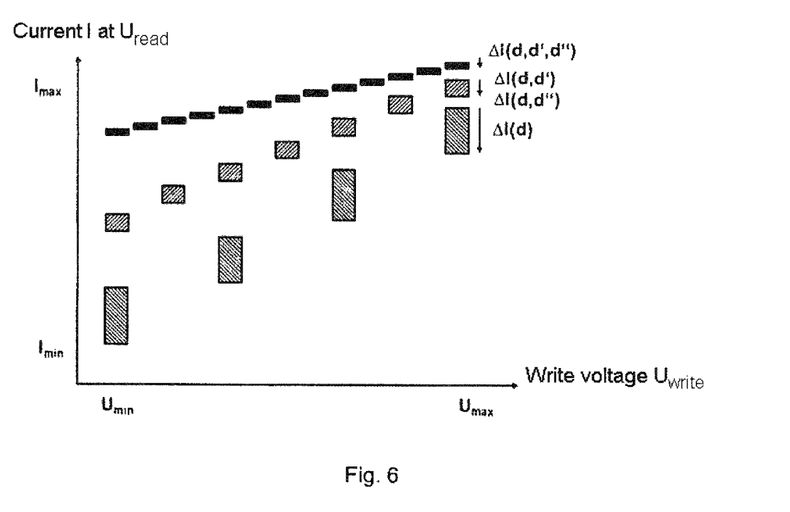
FIG. 6 shows the current I at the read voltage $U_{read}$ in an analog memory 1C as a function of the write voltage $U_{write}$ for an analog memory 1C with 11, with 11 and 11', with 11 and 11", and with 11, 11' and 11".

FIG. 6 shows the read current I at the read voltage $U_{read}$ as a function of the write voltage $U_{write}$. The write voltage $U_{write}$ can assume values between $U_{min}$ and $U_{max}$. If the write voltage is less than $U_{min}$, then the resistance value of the non-volatile integrated analog memory is not changed when this low write voltage $U_{write}$ is applied. If the write voltage $U_{write}$ is greater than $U_{max}$, then an excessively high write current $I_{write}$ flows through the piezo- or ferroelectric material during writing and the piezo- or ferroelectric material is destroyed at least between the two contacts to which an excessively high voltage U was applied. For every write voltage $U_{write}$ between $U_{min}$ and $U_{max}$ it is possible to set a resistance value of the piezo- or ferroelectric material. The constancy of said resistance value $R=U_{read}/I_{read}$ is detected by the change $\Delta I$ in the read current $I_{read}$ at constant read voltage $U_{read}$. The read current decreases at constant read voltage $U_{read}$ with increasing time. Write voltages $U_{write}$ for different resistance values have to be so far apart from one another that the time-dependent change in the read currents $\Delta I(d)$ does not overlap the time-dependent change in the read currents of a different resistance value. As a result of a local modification of the conductive regions 11' or 11", by means of ion beams, laser beams, thermal beams and/or electron beams, the time-dependent change in the read currents $\Delta I(d,d')$ and $\Delta I(d,d")$ decreases. The time-dependent change in the read currents $\Delta I(d,d',d")$ is lowest if the conductive regions 11' and 11" are locally modified. The largest number of different write voltages $U_{write}$ can be defined in this case.

The region 11" and the further regions produced can likewise be modified further.

Figure 7:
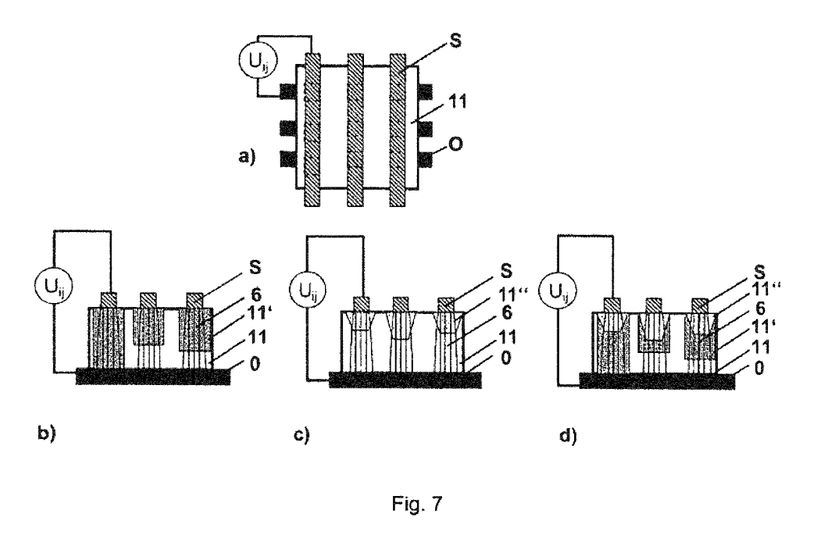
FIG. 7 shows an integrated analog memory 1C in an array structure with a surface contact S and associated mating contact O fitted to different sides and with (a) 11, (b) with 11 and 11', (c) with 11 and 11", and (d) with 11, 11' and 11" between S and O.

FIG. 7 shows the use of the subject matter according to the invention in an array for the case where a maximum of two regions are modified between opposite contacts S and O. The contacts S and associated mating contacts O can be embodied as strips, for example, wherein S and O are rotated at an angle—ideally 90°—with respect to one another. If a voltage U(m,n) is applied between the top-side contact S(m) and the associated mating contact O(n), then upon the application of a voltage U(m,n) between the contacts S(m), O(n) an electric field forms at the crossover point of the two contacts S(m), O(n). The threshold voltage of the individually locally modified regions 11' (FIG. 7 b)) or 11" (FIG. 7c), or of both regions 11' and 11" (FIG. 7 d) can be set by means of modification. This array can specifically be used as a non-volatile analog memory for neuromorphic applications or as a non-volatile analog memory in calibration elements, the realization being of particular interest in CMOS circuits according to the present-day prior art.

In order to achieve an expedient extent of the electric fields in the regions 11, 11', 11", it is recommendable     that the piezo- or ferroelectric material of the layer 11 has a residual electrical conductivity and the concentration of the free charge carriers is in the range of approximately $10^{14}$ to approximately $10^{19}$ cm$^{-3}$, preferably in the range of $10^{15}$ to $10^{18}$ cm$^{-3}$,     the residual electrical conductivity of the modified regions 11' and 11" is changed in comparison with the residual electrical conductivity of the layer 11 and the concentration of the free charge carriers of the modified regions 11' and 11" should vary between approximately $10^{12}$ and approximately $10^{23}$ cm$^{-3}$.

For a layer 11 composed of $BiFeO_3$ it is particularly expedient that the concentration of the free charge carriers before the modification is in a range of $10^{15}$ to $10^{18}$ cm$^{-3}$ and the modification is effected by means of laser irradiation and ion irradiation.

Figure 1:
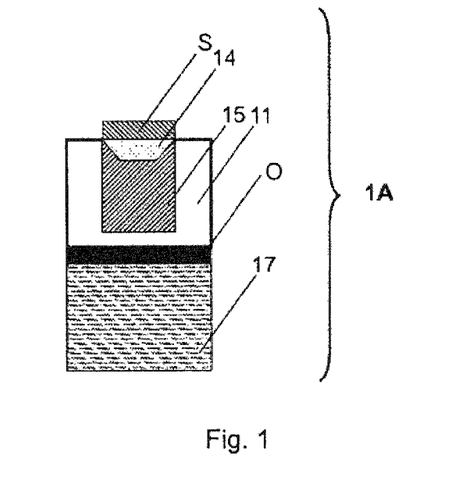
FIG. 1 shows an integrated non-volatile memory component. With surface contact S and associated mating contact O.
Figure 2:
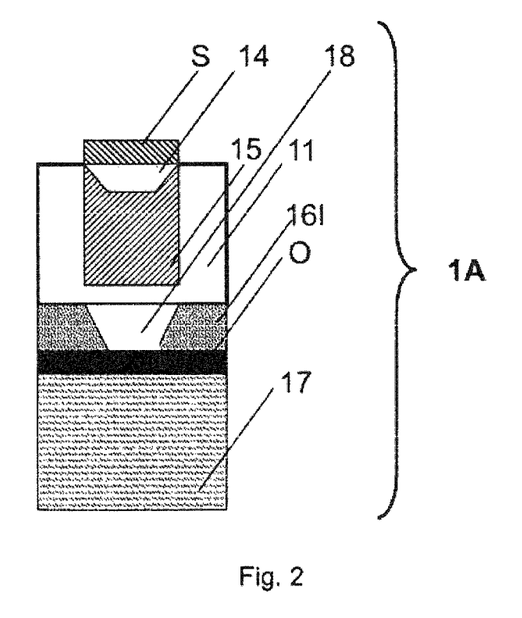
FIG. 2 shows an integrated non-volatile memory component. With surface contact S and associated mating contact O and insulating layer 16.
Figure 8:
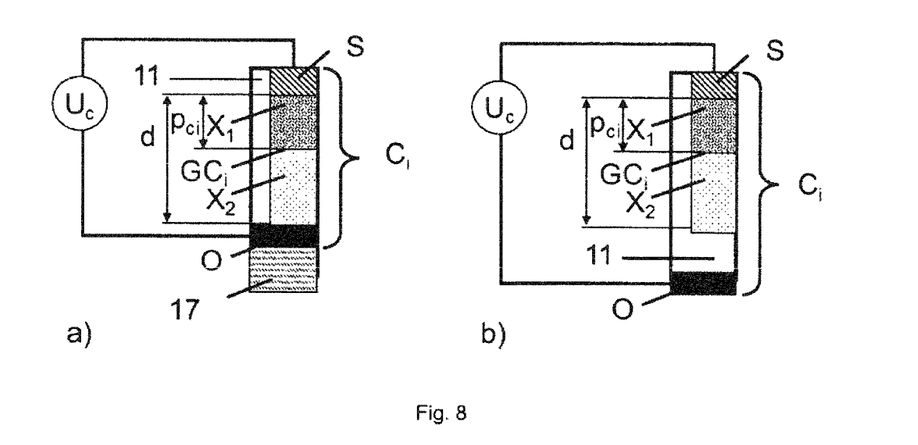
FIG. 8 shows the design of the integrable electrode (a) without and (b) with a material 11 for the design and for the integration.

FIG. 8 shows the design of the integrable static electrode $C_i$, including a surface contact S and a mating contact O, and two regions including piezo- or ferroelectric material $X_1$, $X_2$ having different structural, electronic and/or polarization properties between the contacts S and O. At the interface between the piezo- or ferroelectric materials $X_1$, $X_2$, a statically charged boundary layer $GC_i$ forms at the distance $p_{ci}$ from the surface contact S. The distance $p_{ci}$ of the statically charged boundary layer $G_{ci}$ can be set or shifted in a non-volatile fashion by the application of a voltage. For the design and for the integration of the integrable electrode C, a material can be introduced outside the contacts (FIG. 1(a)) or outside and within the contacts (FIG. 1(b)), wherein the functionality of the integrable electrode C is not influenced by the material 11.

The arrangement shown in FIG. 8 can be extended to a plurality of piezo- or ferroelectric materials $X_i$, $X_{i+1}$ where i>1, wherein at least one of the properties of adjoining materials must differ in order that a statically charged boundary layer is respectively formed there.

Figure 9:
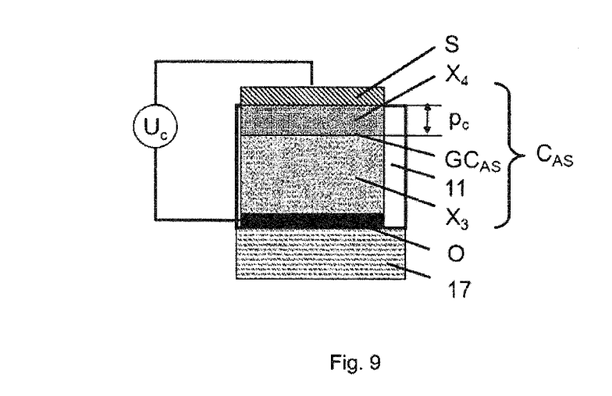
FIG. 9 describes the design of the integrable electrode $C_{AS}$ in the capacitive energy store.

FIG. 9 describes the design of the integrable electrode $C_{AS}$ in the capacitive energy store. The design of the capacitive energy store is identical to the integrable electrode $C_i$ described in FIG. 9, wherein the area $A_{AS}$ of the statically charged boundary layer $GC_{AS}$ of the integrable electrode $C_i$ is chosen to be very large in relation to the adjoining regions, in order that sufficiently high capacities can be realized. The position of the statically charged boundary layer $GC_{AS}$ can be shifted by the application of a voltage between the electrodes S and O.

Figure 10:
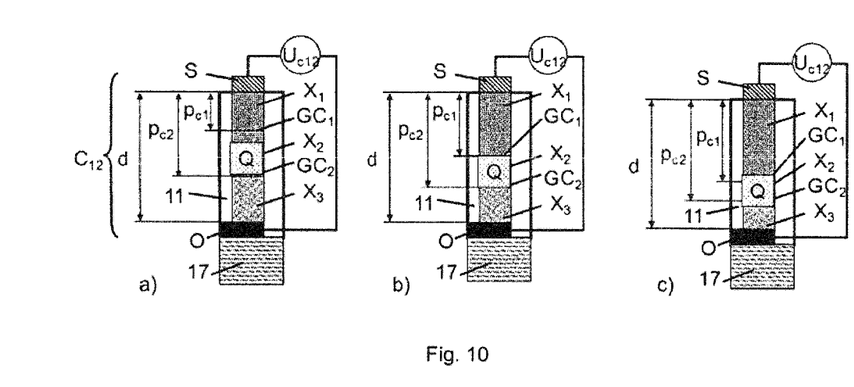
FIG. 10 describes the design of the integrable electrode with three regions of piezo- or ferroelectric materials (a-c) with differently positioned statically charged boundary layers $GC_i$.

FIG. 10 describes the design of an integrable electrode with three regions of piezo- or ferroelectric materials $X_1$, $X_2$ and $X_3$ with differently positioned statically charged boundary layers $GC_i$. The piezo- or ferroelectric material in the region $X_1$ and $X_3$ has a larger electronic bandgap than the piezo- or ferroelectric material in the region $X_2$. In the case of this profile of the electronic band structure and an extent of the region on the nanometers length scale, the region $X_2$ is designated as a quantum well Q. The statically charged boundary layers $GC_1$ and $GC_2$ can be positively or negatively charged. If both boundary layers $GC_1$ and $GC_2$ are identically charged, then oppositely charged free charge carriers are attracted by the boundary layers $GC_1$ and $GC_2$ and collected at the edge of the quantum well Q. Identically charged free charge carriers are repelled by the boundary layers $GC_1$ and $GC_2$ and collected in the center of the quantum well Q. If two adjoining statically charged boundary layers are oppositely charged, then the free charge carriers drift to the respectively oppositely charged static charged boundary layer and collect there. That serves to shift the charge centroid in the quantum well Q.

Figure 3:
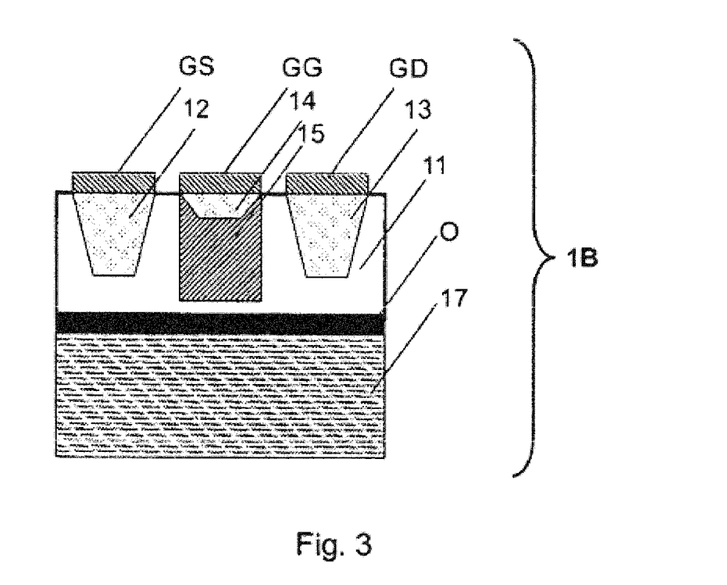
FIG. 3 shows an integrated field effect transistor 1B with source contact GS, gate contact GG and drain contact GD.
Figure 4:
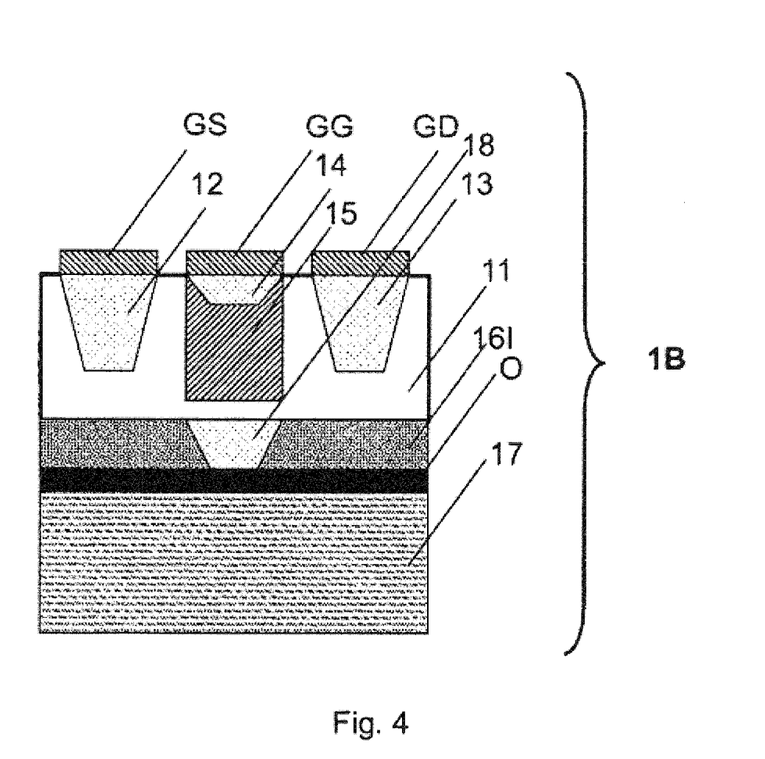
FIG. 4 shows an integrated field effect transistor 1B with source contact GS, gate contact GG and drain contact GD and insulating layer 16.

The extent of the quantum well Q is altered by the application of an external voltage $U_{c12}$. If the extent of the quantum well Q is only a few nanometers, the electronic states for free charge carriers in the quantum well Q are discrete. As the quantum well thickness decreases (FIG. 3(a) to FIG. 3(c)), the energetic distance between the discrete electronic states in the quantum well Q increases and the number of discrete electronic states in the quantum well Q decreases. That can be utilized for electrically controlling the quantum confinement of free charge carriers in a quantum well Q.

If the piezo- or ferroelectric material in the region $X_2$ has a larger electronic bandgap than the piezo- or ferroelectric material in the regions $X_1$ and $X_3$, then the region $X_2$ is designated as a tunnel barrier T. If both boundary layers $GC_1$ and $GC_2$ are identically charged, then oppositely charged free charge carriers are attracted by the boundary layers $GC_1$ and $GC_2$ and collected at the edge of the tunnel barrier T. Identically charged free charge carriers are repelled by the boundary layers $GC_1$ and $GC_2$ and collected outside the tunnel barrier T. If two adjoining statically charged boundary layers are oppositely charged, then the free charge carriers drift to the respectively oppositely charged static charged boundary layer and collect there. That serves to shift the charge centroid outside the tunnel barrier T.

As the tunnel barrier thickness decreases, the probability increases that free charge carriers can tunnel through the tunnel barrier T. That can be utilized for electrically controlling the tunnel effect of free charge carriers through a tunnel barrier T.

Figure 11:
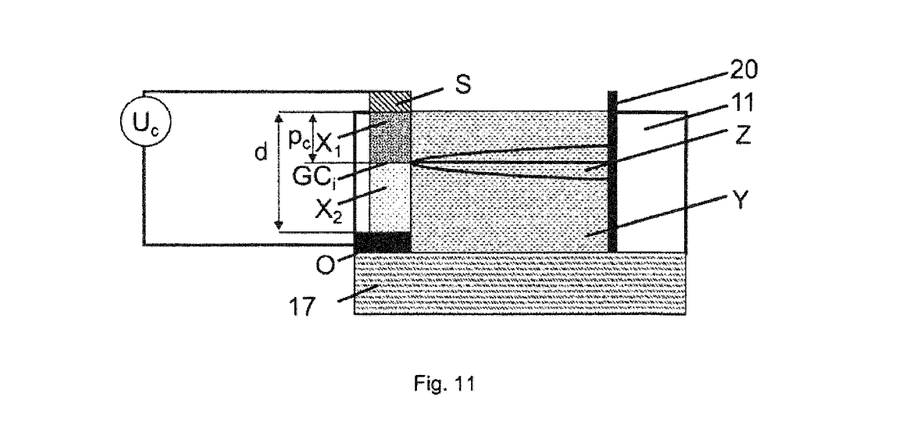
FIG. 11 describes the use of the integrable electrode with counterelectrode 20 in a component having an active zone Y.

FIG. 11 describes the use of the integrable electrode $C_i$ with counterelectrode 20 in a component having an active zone Y. The integrable electrode $C_i$ and the counterelectrode 20 adjoin different locations of the active zone Y and do not touch one another. An electric field forms within the region Z between the integrable electrode $C_i$ and the counterelectrode 20. The statically charged boundary layer $GC_i$ in the integrable electrode $C_i$ and the region Z in the active zone Y are shifted by the application of an external voltage $U_c$.

Figure 12:
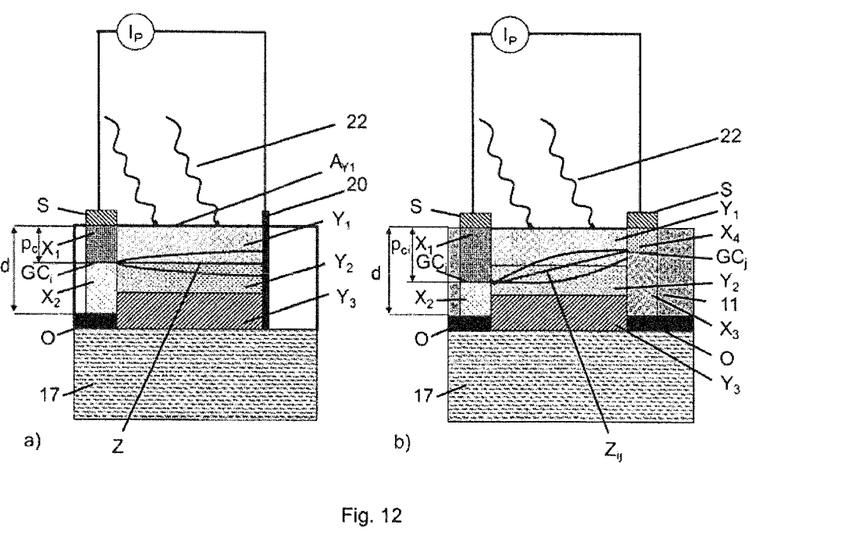
FIG. 12 describes the use (a) of one integrable electrode with counterelectrode and (b) of two integrable electrodes in a component having active zones $Y_1$.

FIG. 12 describes the use (a) of one integrable electrode $C_i$ with counterelectrode 20 and (b) with two integrable electrodes $C_i$ and $C_j$ in a component having active zones $Y_1$, $Y_2$ and $Y_3$. The integrable electrodes $C_i$ and $C_j$ (FIG. 12(a)) or the integrable electrode $C_i$ and the counterelectrode 20 (FIG. 12(b)) adjoin each active zone $Y_1$, $Y_2$ and $Y_3$ at different locations, without directly touching one another in this case. An electric field forms in the region Z in the active zones $Y_1$, $Y_2$ and $Y_3$ between the statically charged boundary layer $GC_i$ and the counterelectrode 20 (FIG. 12(a)) or in the region $Z_{ij}$ active zones $Y_1$, $Y_2$ and $Y_3$ between the statically charged boundary layers $GC_i$ and $GC_j$. The region Z, $Z_{ij}$ is shifted by the application of an external voltage.

If the active zones $Y_1$, $Y_2$ and $Y_3$ are absorber materials for absorbing electromagnetic waves 22, then the arrangement in FIG. 5 can be used as a photocomponent.

If the active zones $Y_1$, $Y_2$ and $Y_3$ are absorber materials for absorbing charged and uncharged particles 22, then the arrangement in FIG. 5 can be used as a particle detector.

Figure 13:
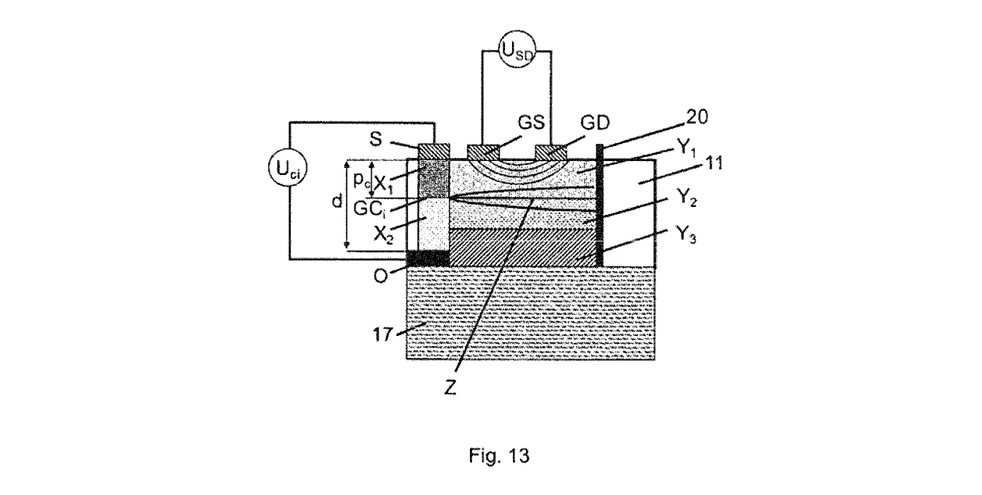
FIG. 13 describes the use of the integrable electrode $C_i$ with counterelectrode 20 and FIG. 14 describes the use of two integrable electrodes $C_i$ and $C_j$ in a logic component.

FIG. 13 describes the use of the integrable electrode $C_i$ with the active zones $Y_1$, $Y_2$ and $Y_3$ and with counterelectrode 20 in a logic component, wherein a source electrode GS and a drain electrode GE are connected to the active zone $Y_1$ and the integrable electrode $C_i$ and counterelectrode 20 are used as control electrode. When a voltage $U_{SD}$ is applied between the source electrode GS and the drain electrode GE, the extent of the electric field between the source electrode GS and the drain electrode GE is controlled by the electric field set in a non-volatile fashion in the region Z between the integrable electrode $C_i$ and the counterelectrode 20.

Figure 14:
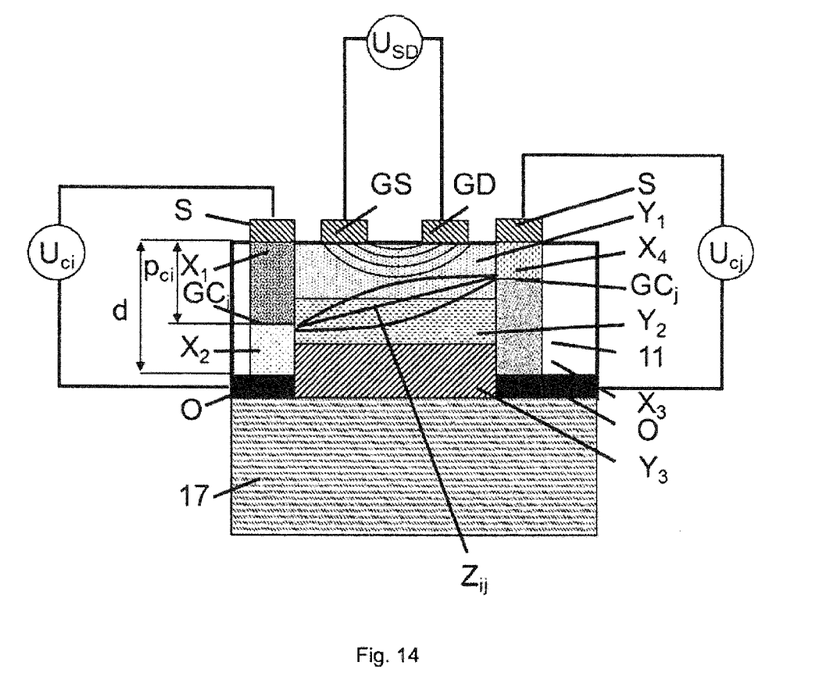

FIG. 14 describes the use of the integrable electrodes $GC_i$ and $GC_j$ with the active zones $Y_1$, $Y_2$ and $Y_3$ in a logic component, wherein a source electrode GS and a drain electrode GE are connected to the active zone $Y_1$ and the integrable electrodes $C_i$ and $C_j$ are used as control electrode. When a voltage $U_{SD}$ is applied between the source electrode GS and the drain electrode GE, the extent of the electric field between the source electrode GS and the drain electrode GE is controlled by the electric field set in a non-volatile fashion in the region $Z_{ij}$ between the integrable electrodes $C_i$ and $C_j$.

Figure 15:
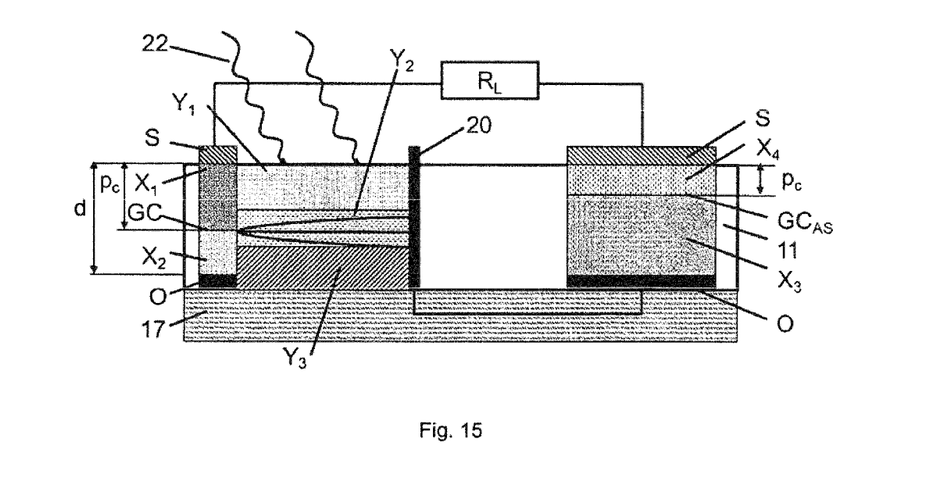
FIG. 15 describes the use of a plurality of integrable electrodes for combination with different functions.

FIG. 15 describes the use of a plurality of integrable electrodes in combination. The figure shows the use of the integrable electrode C with counterelectrode 20 and adjoining active zones $Y_1$, $Y_2$ and $Y_3$ for absorbing electromagnetic waves 22 and/or for absorbing charged and uncharged particles, and the use of a capacitive energy store $C_{AS}$ in combination with a load resistor $R_L$.

Embodiments

The integrated non-volatile memory component according to the disclosure includes a bottom contact O and top contact S, wherein at least one of these two contacts is embodied as a rectifying contact, and a ferroelectric layer 11 as a conductive channel between bottom contact O and top contact S.

For producing an integrated non-volatile memory element according to the disclosure, a ferroelectric layer is applied on a rectifying or non-rectifying bottom contact. The conductivity of the ferroelectric layer is locally modified within individual regions. The regions can be modified by means of ion implantation, preferably oxygen, helium, or argon ions, and subsequent thermal treatment in the range of the growth temperature of the ferroelectric layer. The growth temperature is between room temperature and 1000° C., preferably between 550° C. and 600° C. for $BiFeO_3$. A rectifying or non-rectifying top contact is then applied. What is important here is that at least one of the two contacts is embodied as a rectifying contact.

Optionally, an insulating layer 16I having a high crystallization temperature can be applied before the ferroelectric layer 11 is applied to the bottom contact. The advantage of this layer is that the conductive modified region does not touch the bottom contact. Moreover, for reducing the leakage currents, the ferroelectric layer need not necessarily be pinhole-free.

The rectifying contact can be embodied as a Schottky contact, other rectifying contacts also being possible.

Extension of the Integrated Non-Volatile Memory Component to an Integrated Field Effect Transistor An integrated field effect transistor with non-volatile memory component includes a drain terminal GD, a source terminal GS, a control gate terminal GG, conductive channels in a ferroelectric layer 11, wherein the conductive channel of the control gate terminal GG is a ferroelectric layer and the conductivity between the drain terminal and the source terminal can be controlled via the control gate terminal.

A further embodiment according to the disclosure is the use of the ferroelectric layer in the drain and source terminal regions as well.

The integrated field effect transistor is produced by a ferroelectric layer being applied to the substrate or to a bulk electrode if a MOSFET with integrated memory component is intended to be produced. The conductivity of the ferroelectric layer is locally modified within individual regions. The regions can be modified by means of ion implantation, preferably oxygen, helium or argon ions, and subsequent thermal treatment in the range of the growth temperature of the ferroelectric layer. The growth temperature is between room temperature and 1000° C., preferably between 500° C. and 600° C. for $BiFeO_3$. The rectifying control gate contact GG and the source and drain contacts GS, GD are then applied.

Optionally, the conductivity of the ferroelectric layer can be locally modified by means of ion implantation and subsequent thermal annealing not only in the control gate terminal region 14 but also in the source and/or drain terminal region 12, 13.

Optionally, as in the case of the integrated memory component, an insulating layer having a high crystallization temperature can be applied to the substrate or the bulk electrode before the ferroelectric layer is applied.

The rectifying contacts are preferably embodied as Schottky contacts, other rectifying contacts also being able to be used.

The ferroelectric layer preferably consists of $BiFeO_3$. Other piezoelectric or pyroelectric materials can also be used as the ferroelectric layer.

A further advantageous configuration of the disclosure is the utilization of ferromagnetic contact materials having in-plane magnetization M for coupling to the ferroelectric layer having out-of-plane ferroelectricity P. The coupling thus produced is proportional to the cross product M×P.

Integrated Non-Volatile Analog Memory in Adaptive Synaptic Matrix

The arrangement according to the disclosure in array form can be used as an adaptive synaptic matrix or individual elements can be used as adaptive synapses for the realization of cognitive processing functions, for example in CMOS circuits. In this case, a significant improvement over the prior art results firstly from the higher integration density of the analog memory according to the disclosure, whereby more complex processing functions become possible. In addition, comparable previously known analog memories in CMOS circuits are volatile, thereby making it more difficult to fix a processing function once programmed. The analog memory according to the disclosure is able to store processing functions without time limitation.

Integrated Non-Volatile Analog Memory in CMOS Integrated Analog-to-Digital Converters The arrangement according to the disclosure can be used as a permanently storing calibration element, for example for characteristic curve correction. The realization is preferably effected in CMOS circuits according to the present-day prior art. In comparison with the laser-trimmed resistors used heretofore in CMOS technology, using the subject matter according to the disclosure, higher packing densities are achieved and the calibration element can be programmed more rapidly and purely electrically. As a result, the final manufacture of the circuits becomes more cost-effective and the use of the permanently storing calibration elements is more energy-efficient.

Photocomponent with Integrable Electrode

The arrangement according to the disclosure can be used as a photocomponent with integrable electrode and statically charged boundary layer, the position of which is altered in a non-volatile fashion by the application of a voltage between the surface contact and the mating contact of the integrable electrode. The charged boundary layer can be utilized as an anode or cathode of a photodiode if a cathode or respectively anode is introduced or fitted additionally into the piezo- or ferroelectric region, outside the region between surface contact and associated mating contact, said cathode or respectively anode ideally being introduced or fitted at a distance perpendicularly with respect to the charged boundary layer at a light-absorbing region, which can consist of different light-absorbing materials. The photoelement can be utilized as a photodetector with an arbitrarily positionable charged boundary layer, wherein the photocurrent can thereby be modulated in the light-absorbing region. Statements about the spectral composition of the incident light can be made by virtue of the arrangement of a plurality of counterelectrodes and the simultaneous use of different absorber materials. The photocomponent can be used as a solar cell with arbitrarily configurable electric field distributions in the absorber material. One main advantage is that the absorber material in this solar cell manages without the intrinsic electric fields required heretofore and is not shaded by contact electrodes. As a result, greater photocurrents are generated between the integrable statically charged electrode and counterelectrode. When the arrangement is used as a solar cell, it is possible to arrange different absorber materials as is in a tandem solar cell. One main advantage is that the charge carriers that are photogenerated in an absorber material, as a result of the switchable distribution of the electric field do not necessarily drift into another adjacent absorber material of the tandem solar cell, and that the probability of recombination for photogenerated charge carriers on the path between anode and cathode is reduced as a result.

Capacitive Energy Store

The arrangement according to the disclosure can be used as a non-volatile capacitive energy store. The realization is effected according to the present-day prior art preferably as an integrable electrode with a statically charged boundary layer having a large area, wherein the position of the charged boundary layer is shifted in a non-volatile fashion during charging and discharging of the capacitive energy store. The capacitively stored energy (0.5×capacitance×voltage×voltage) is approximately 8 µJ/cm² in integrable electrodes $C_i$ including the ferroelectric material $BiFeO_3$ in two different phases. Energies of the order of magnitude of a few nJ/cm² are required for nanomotors and other lab-on-the-chip applications. The capacitively stored energy is particularly dependent on the polarization properties, here the polarization charge of adjoining piezo- or ferroelectric materials $X_i$, $X_{i+1}$. The difference in the polarization charge is a maximum of a few 100 µC/cm² and maximum capacitively storable energy densities of a few 100 µJ/cm² are achievable. However, the effective area (footprint) can be decreased by up to 100 to 1000 by nanostructuring or by roll-up methods, with the result that capacitively storable energy densities of $10^4$ to $10^7$ µC/cm² are conceivable.

One main advantage is that the arrangement according to the disclosure as a solar cell can be embodied in combination with the arrangement according to the disclosure as a capacitive energy store, see FIG. 15. The generation and storage of energy on circuits thereby becomes more cost-effective and energy-efficient.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

REFERENCE SIGNS

S, O Surface contact (top contact) and associated mating contact (bottom contact)
GS Source contact
GG Top contact (gate)
GD Drain contact
1A Integrable non-volatile memory component
1B Integrable field effect transistor
1C Integrable analog memory
C, $C_i$, $C_j$ Integrable electrode
2 Modifying beams e.g. laser, thermal, ion or electron beams
6 Region between two contacts in which an electric field forms and current can flow when voltage U is applied to the two contacts
11 Piezo- or ferroelectric layer in the strain-free phase, material in and/or outside the integrable electrode C for the design and for the integration of the integrable electrode C, wherein the functionality of the integrable electrode C is not influenced by the material 11
11' Modified, ferroelectric region of 11
11" Modified, ferroelectric region of 11' in contact with the surface contact S and/or with the associated mating contact O
d Thickness of the piezo- or ferroelectric layer before modification between S and O
d', d" Thickness of the modified, ferroelectric, conducting region 11' (d') and 11" (d")
U, $U_1$, $U_2$, $U_{ij}$ Voltage
I, $I_1$, $I_2$, $I_{ij}$ Current
R, $R_1$, $R_2$, $R_{ij}$ Resistance
12 Source contact terminal region
13 Drain contact terminal region
14 Top contact terminal region
15 Region of lowest conductivity between surface contact S and associated mating contact O in which the strained phase is set above the critical electric field strength or threshold voltage $U_{crit}$
16I Insulating layer
16S Structure boundary between two different phases of the piezo- or ferroelectric layer
17 Substrate/carrier material/integrated circuit
18 Mating contact terminal region
20 Counterelectrode with respect to the integrable electrode C
22 Electromagnetic waves, particles
d Thickness of the piezo- or ferroelectric layer before modification
d', d" Thickness of the modified, ferroelectric, conducting region 11' (d') and 11" (d")
$U_{write}$ Write voltage ($U_{write}$)
$U_{read}$ Read voltage ($U_{read}$)
$U_{crit}$ Threshold voltage for setting the strained phase of the region 15
I@ $U_{read}$ Current when a read voltage $U_{read}$ is present
Δt Retention time
ΔI(d) Change in current during the retention time Δt for a non-modified, integrated resistive component (d'=d"=0)
ΔI(d,d'), Change in current during the retention time Δt for an integrated resistive component (d"=0) with modified ferroelectric region 11' (d>d')
ΔI(d, d") Change in current during the retention time Δt for an integrated resistive component (d'=0) with modified ferroelectric region 11" (d>d")
ΔI (d, d',d") Change in current during the retention time Δt for an integrated resistive component with modified ferroelectric regions 11' and 11" (d>d'>d")
$GC_i$ Statically charged boundary layer in the integrable electrode $C_i$
$p_{Ci}$ Position of the statically charged boundary layer $GC_i$ in the integrable electrode $C_i$ between the contacts S and O
X, $X_i$ Regions including piezo- or ferroelectric material having different structural, electronic and/or polarization properties
Y, $Y_i$ Active zone of a semiconductor component
$A_Y$, $V_Y$ Top/bottom surface and volume of the active zone Y
$U_{ci}$ Externally applied voltage for positioning the statically charged boundary layer $GC_i$ in the integrable electrode $C_i$
$Q_i$, $T_i$ Electrically switchable quantum wells Q and tunnel barriers T
$Z_i$ Region between the statically charged boundary layer $GC_i$ in the integrable electrode $C_i$ and the associated counterelectrode 20 in which an electric field forms
$Z_{ij}$ Region between the statically charged boundary layer $GC_i$ in the integrable electrode $C_i$ and the associated statically charged boundary layer $GC_j$ in the integrable counterelectrode $C_j$ in which an electric field forms
$I_p$ Current of the free charge carriers which are generated by the absorption of electromagnetic waves 22 in the absorber material $Y_i$ in the photocomponent and which are separated in $Z_i$ or $Z_{ij}$ and reach the associated electrodes C, $C_i$, $C_j$, 20, or current which is generated by the captured particles 22 in the particle detector
$U_{SD}$ Voltage between source electrode GS and drain electrode GD
$R_L$ Load resistor

What is claimed is:
1. An integrated non-volatile component, comprising:
a surface contact with associated mating contact, a ferroelectric layer used as a conductive channel having variable conductivity and the surface contact and/or the associated mating contact are/is embodied as a rectifying contact and, as a result of an applied voltage between the surface contact and the associated mating contact, a non-volatile space charge zone forms around the surface contact and/or above the mating contact in the ferroelectric layer, wherein the surface contact is in direct contact with the ferroelectric layer; and a drain terminal and a source terminal, wherein the surface contact is configured as a control gate terminal controlling the conductivity of the conductive channel between the drain terminal and the source terminal; wherein the drain terminal and the source terminal are respectively in direct contact with the ferroelectric layer.

2. The integrated non-volatile component as claimed in claim 1, wherein the surface contact terminal region and/or the mating contact terminal region are/is locally modified by ion implantation with subsequent thermal treatment.

3. The integrated non-volatile component as claimed in claim 1, wherein the rectifying contact is embodied as a Schottky contact.

4. The integrated non-volatile component as claimed in claim 1, wherein an insulating layer is introduced between the ferroelectric layer and the mating contact and the insulating layer is interrupted in the mating contact terminal region.

5. The integrated non-volatile component as claimed in claim 1, wherein a resistance of the non-volatile space charge zone is defined by application of a voltage between surface contact and the associated mating contact and by the material used.

6. The integrated non-volatile component as claimed in claim 1, wherein the ferroelectric layer consists of $BiFeO_3$.

7. The integrated non-volatile component as claimed in claim 1, wherein at least one of the contacts consists of ferromagnetic material having in-plane magnetization in order to achieve a coupling to the out-of-plane ferroelectricity of the ferroelectric layer.

8. An integrated non-volatile component, comprising a surface contact with associated mating contact, a $BiFeO_3$ layer with a concentration of free charge carriers in a range of $10^{15}$ to $10^{18}$ $cm^{-3}$ used as a conductive channel having variable conductivity and the surface contact and/or the associated mating contact are/is embodied as a rectifying contact and, as a result of an applied voltage between the surface contact and the associated mating contact, a non-volatile space charge zone forms around the surface contact and/or above the mating contact in the $BiFeO_3$ layer, wherein the surface contact is in direct contact with the $BiFeO_3$ layer; and a drain terminal and a source terminal, wherein the surface contact is configured as a control gate terminal controlling the conductivity of the conductive channel between the drain terminal and the source terminal; wherein the drain terminal and the source terminal are respectively in direct contact with the $BiFeO_3$ layer.

* * * * *